US010141476B2

(12) United States Patent
Huang et al.

(10) Patent No.: US 10,141,476 B2
(45) Date of Patent: Nov. 27, 2018

(54) LIGHT EMITTING DIODE CHIP SCALE PACKAGING STRUCTURE

(71) Applicant: Lextar Electronics Corporation, Hsinchu (TW)

(72) Inventors: Che-Hsuan Huang, Taoyuan (TW); Shu-Hsiu Chang, Taoyuan (TW); Hsin-Lun Su, Chiayi County (TW); Chih-Hao Lin, Taipei (TW); Tzong-Liang Tsai, Taichung (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/618,190

(22) Filed: Jun. 9, 2017

(65) Prior Publication Data

US 2017/0358709 A1 Dec. 14, 2017

(30) Foreign Application Priority Data

Jun. 13, 2016 (TW) .............................. 105118389 A

(51) Int. Cl.
| | |
|---|---|
| *H01L 33/58* | (2010.01) |
| *H01L 33/20* | (2010.01) |
| *H01L 33/50* | (2010.01) |
| *H01L 27/15* | (2006.01) |
| *H01L 33/52* | (2010.01) |

(52) U.S. Cl.
CPC ............ *H01L 33/20* (2013.01); *H01L 27/156* (2013.01); *H01L 33/50* (2013.01); *H01L 33/52* (2013.01); *H01L 33/58* (2013.01); *H01L 2933/005* (2013.01); *H01L 2933/0058* (2013.01)

(58) Field of Classification Search
CPC .......... H01L 33/00–33/648; F21V 5/04–5/048
See application file for complete search history.

(56) References Cited

U.S. PATENT DOCUMENTS

| | | | | |
|---|---|---|---|---|
| 8,172,433 | B2 * | 5/2012 | Muschaweck | G02B 27/0927 362/311.1 |
| 8,324,796 | B2 * | 12/2012 | Matsuki | G02F 1/133603 257/40 |
| 8,368,097 | B2 | 2/2013 | Kim et al. | |

(Continued)

OTHER PUBLICATIONS

CN Office Action dated Sep. 27, 2018 in Chinese application (No. 201710417494.7).

*Primary Examiner* — Eric Ward
(74) *Attorney, Agent, or Firm* — McClure, Qualey & Rodack, LLP

(57) ABSTRACT

A light emitting diode chip scale packaging structure is disclosed. The light emitting diode chip scale packaging structure comprises a light emitting diode chip and a lens. The lens covers the light emitting diode chip. A curve of an outer surface of the lens in a cross-section view substantially complies with a polynomial of:

$$z = \Sigma_{i=0}^{n} a_i * y^i,$$

A center point of the curve corresponding to the light emitting diode chip is a zero point of y-z coordinate axes. z is a variable of vertical axis of the curve. y is a variable of horizontal axis of the curve. $a_i$ is a constant coefficient in a term of $i^{th}$ degree. $3 < n \le 6$.

11 Claims, 8 Drawing Sheets

(56) References Cited

U.S. PATENT DOCUMENTS

| | | | | |
|---|---|---|---|---|
| 8,674,391 B2* | 3/2014 | Brick | ............ | H01L 33/54 |
| | | | | 257/98 |
| 2007/0115660 A1* | 5/2007 | Lee | ............ | G02F 1/133603 |
| | | | | 362/240 |
| 2008/0089062 A1* | 4/2008 | Vennetier | ............ | G02B 19/0066 |
| | | | | 362/241 |
| 2009/0273727 A1* | 11/2009 | Kubota | ............ | G02B 5/265 |
| | | | | 349/62 |
| 2010/0203658 A1* | 8/2010 | Aida | ............ | H01L 33/52 |
| | | | | 438/27 |
| 2012/0068212 A1* | 3/2012 | Komoto | ............ | H01L 33/54 |
| | | | | 257/98 |
| 2012/0170281 A1* | 7/2012 | Yu | ............ | F21V 5/04 |
| | | | | 362/335 |
| 2015/0192256 A1* | 7/2015 | Hyun | ............ | F21V 5/04 |
| | | | | 362/335 |
| 2016/0102816 A1* | 4/2016 | Li | ............ | F21V 5/04 |
| | | | | 362/97.1 |
| 2016/0348873 A1* | 12/2016 | Lin | ............ | F21V 5/04 |
| 2016/0351760 A1* | 12/2016 | Hayashi | ............ | H01L 33/58 |

* cited by examiner

LIGHT EMITTING DIODE CHIP SCALE PACKAGING STRUCTURE

BACKGROUND

This application claims the benefit of Taiwan application Serial No. 105118389, filed Jun. 13, 2016, the subject matter of which is incorporated herein by reference.

Technical Field

The disclosure relates to a light emitting diode packaging structure, and more particularly to a light emitting diode packaging structure having a lens.

Description of the Related Art

Due to advantages of long lifetime, small volume, great resistance to vibration, low heat emission, and low power consumption, light emitting diodes (LEDs) have been extensively applied in various home appliances and instruments as indicators or light sources. With recent development towards multicolor and high illumination, the applications of the LEDs are extended to various display devices, lighting devices, etc.

A displaying effect of a product would be affected by a luminescence property of a device.

For example, a liquid crystal display device may use a back light module. A direct type back light module may use a light emitting diode as a light source together with a lens. A scheme of a direct type light emitting module uses a reflective lens, which can lead the majority of a light from a light emitting diode toward a bottom surface of a module with having a larger light-mixing pathway. This scheme can achieve a thinner design. However, a manufacturing process for the device often requires a high accuracy and relates to a pack plate design for a module, with high technical difficulty. In addition, a tolerance for an optical shift is low. Therefore, there are the problems of risk of disposing an element and cost needed to be overcome.

Another scheme of the direct type light emitting uses a refractive lens, which can directly lead a light from a light emitting diode as a light source to a plane to be imaged by the lens. The scheme using the reflective lens has a larger manufacturing tolerance. However, it is very difficult to achieve a thin product when using the refractive lens with limitation of its physical threshold. Moreover, there is an undesirable optical phenomenon resulted from a shift of disposing an element during assembling a whole module, which relates to an accuracy problem of the disposing step.

SUMMARY

The present disclosure provides a light emitting diode chip scale packaging structure.

According to a concept of the present disclosure, a light emitting diode chip scale packaging structure is provided. The light emitting diode chip scale packaging structure comprises a light emitting diode chip and a lens. The lens covers the light emitting diode chip. A curve of an outer surface of the lens in a cross-section view substantially complies with a polynomial of:

$$z = \sum_{i=0}^{n} a_i * y^i,$$

A center point of the curve corresponding to the light emitting diode chip is a zero point of y-z coordinate axes. z is a variable of vertical axis of the curve. y is a variable of horizontal axis of the curve. $a_i$ is a constant coefficient in a term of $i^{th}$ degree. $3 < n \leq 6$.

Figure 1:
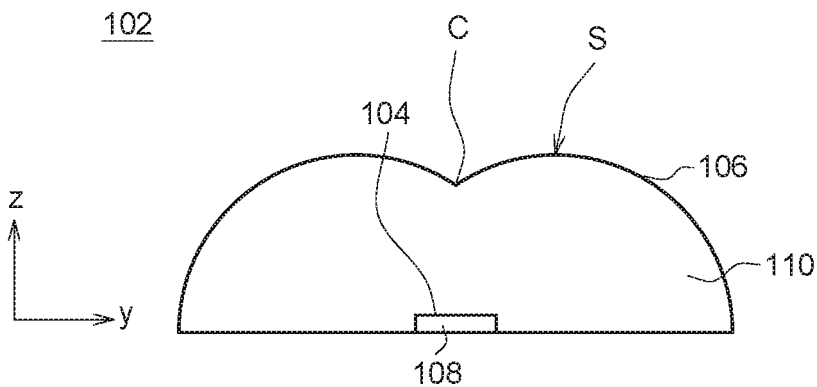
FIG. 1 illustrates a cross-section view of a light emitting diode packaging structure according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Embodiments in the present disclosure provide a light emitting diode packaging structure such as a light emitting diode chip scale packaging structure, and a light emitting device comprising the light emitting diode packaging structure, and a manufacturing method for the same. The light emitting diode packaging structure can reveal excellent luminous efficiency and display effect.

Embodiments are provided hereinafter with reference to the accompanying drawings for describing the related procedures and configurations. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

FIG. 1 illustrates a light emitting diode packaging structure 102 according to embodiments. For example, the light emitting diode packaging structure 102 is a light emitting diode chip scale packaging structure. The light emitting diode packaging structure 102 comprises a light emitting unit 104 and a lens 106 covering the light emitting unit 104.

In embodiments, a curve of an outer surface S of the lens 106 in the cross-section view complies with (or substantially complies with) a polynomial (I) of:

$$z = \sum_{i=0}^{n} a_i * y^i \qquad (I).$$

A center point C of the curve corresponding to a light emitting diode chip 108 is a zero point of y-z coordinate axes. z is a variable of vertical axis of the curve of the outer surface S in the cross-section view. y is a variable of horizontal axis of the curve of the outer surface S in the cross-section view. $a_i$ is a constant coefficient in a term of ith degree in the polynomial (I). In embodiments, in the polynomial (I), n>3. In other words, the polynomial (I) has a degree of at least 4. For example, 3<n≤6. In the present disclosure, the description that the curve "substantially complies with" the polynomial (I) means a correlation coefficient calculated from fitting the curve to the polynomial (I) is larger than or equal to 0.995 (i.e. 0.995~1). In other words, in the present disclosure, the description that the curve "complies with" the polynomial (I) means the correlation coefficient calculated from fitting the curve to the polynomial (I) is 1.

In some embodiments, in the polynomial (I), n=6, $a_6 \neq 0$, and in other words the polynomial (I) has the degree of 6. For example, n=6, $a_0$ is a non-zero constant, $a_1$ is a non-zero constant, $a_2$ is a non-zero constant, $a_3$ is a non-zero constant, $a_4$ is a non-zero constant, $a_5$ is a non-zero constant, and $a_6$ is a non-zero constant.

In an embodiment, the curve substantially complies with a polynomial of: the polynomial (I) that the curve complies with (or substantially complies with) is:

$$z=-0.0005y^6-0.0059y^5+0.0871y^4-0.3718y^3+0.5658y^2-0.0709y+2.5046.$$

Figure 9:
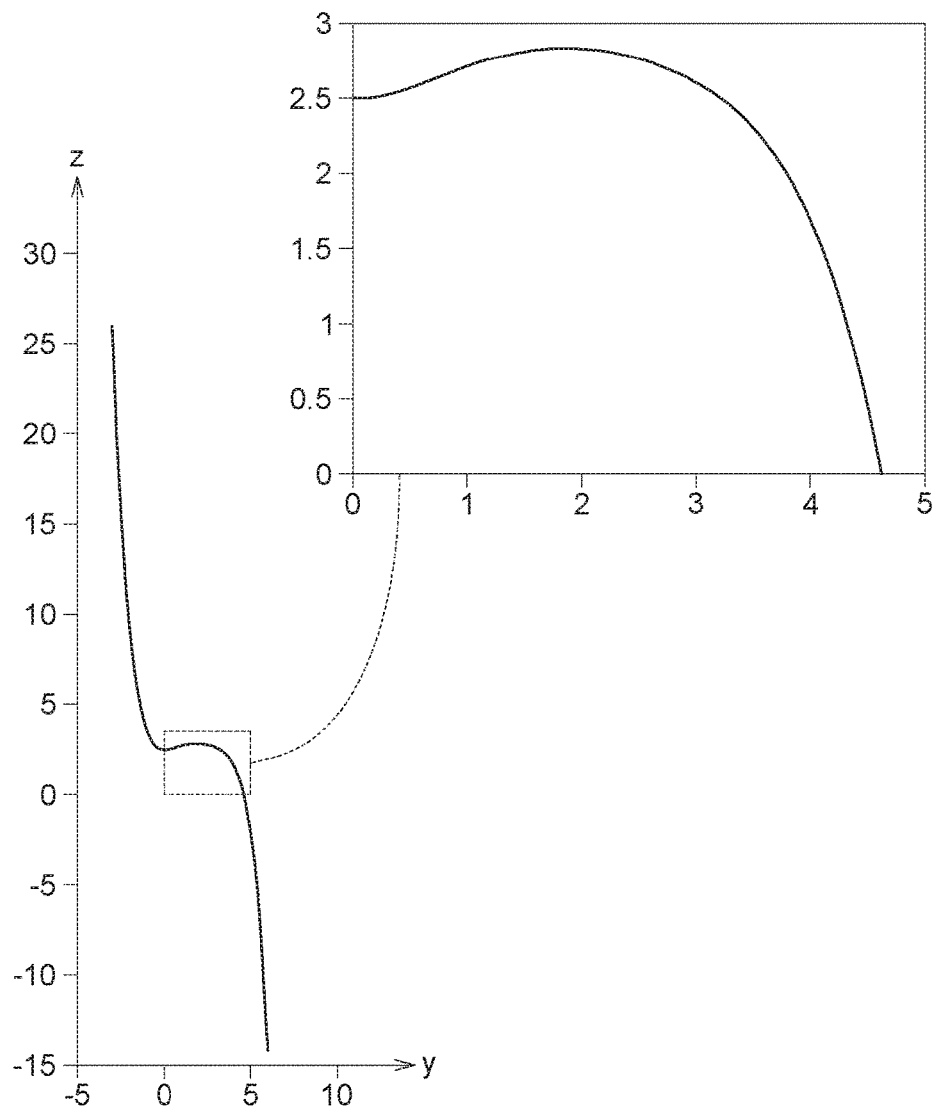
FIG. 9 shows a curve complying with the function $$z = -0.0005y^6 - 0.0059y^5 + 0.0871y^4 - 0.3718y^3 + 0.5658y^2 - 0.0709y + 2.5046.$$

In other words, in the polynomial (I), n=6, $a_0$=2.5046, $a_1$=−0.0709y, $a_2$=0.5658, $a_3$=−0.3718, $a_4$=0.0871, $a_5$=−0.0059, and $a_6$=−0.0005, and a curve complying which is shown in FIG. 9, wherein a rectangular frame is for a portion of a the curve where y is zero to z is zero. For example, the center point C of the curve in the cross-section view of the outer surface S shown in FIG. 1 may correspond to the point at which y is zero in the curve in FIG. 9.

Slopes of segment curved surfaces may be calculated by an inverse scheme using Snell's law so as to direct a light to designated locations to obtain a designated optical pattern.

In some embodiments, the lens having the outer surface with the curve of which in the cross-section view (substantially) complying with the polynomial (I) having the degree of at least 4 is applied for a direct type back light module to direct a light to a desired location precisely such that the device can have an improved display effect. Without being limited thereto, the lens having the outer surface with the curve of which in the cross-section view (substantially) complying with the polynomial (I) having the degree of at least 4 may be applied to other kinds of illumination or display devices.

In embodiments, the lens 106 comprises a packaging encapsulant 110, or consists of the packaging encapsulant 110. The lens 106 is in contact with the light emitting unit 104. For example, there is no air gap between the lens 106 and the light emitting unit 104.

In embodiments, the light emitting unit 104 comprises the light emitting diode chip 108. For example, the packaging encapsulant 110 that the lens 106 consists of is in contact with the light emitting diode chip 108. Alternatively, there is no air gap between the packaging encapsulant 110 and the light emitting diode chip 108. In the embodiment, there is no additional air gap between the light emitting unit 104 and the packaging encapsulant 110, and thus the structure can have a small thickness, which facilitates miniaturizing or thinning designs as applied to a device such as a direct type back light module.

In the embodiment as shown in FIG. 1, the outer surface S (continuous curved surface) of the lens 106 has a concave structure. The center point C of the curve in the cross-section view of the outer surface S is the lowest point of the concave structure.

However, the present disclosure is not limited thereto. In other embodiments, the outer surface of the lens may have a convex structure, and a center point of the curve of the outer surface in the cross-section view is the highest point of the convex structure.

In addition, in embodiments, the lens having the outer surface with the curve of which in the cross-section view (substantially) complying with the polynomial (I) having the degree of at least 4 may be applied as a Fresnel lens structure having the same curvature for the outer curved surface so as to reduce a material quantity, a manufacturing cost, a weight, a volume and a thickness for the lens.

Figure 2A:
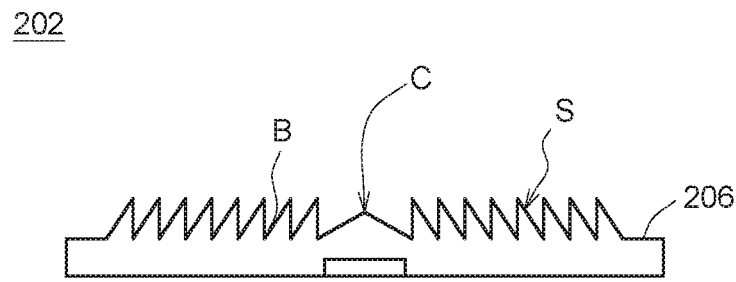
FIG. 2A illustrates a cross-section view of a light emitting diode packaging structure according to another embodiment.
Figure 2B:
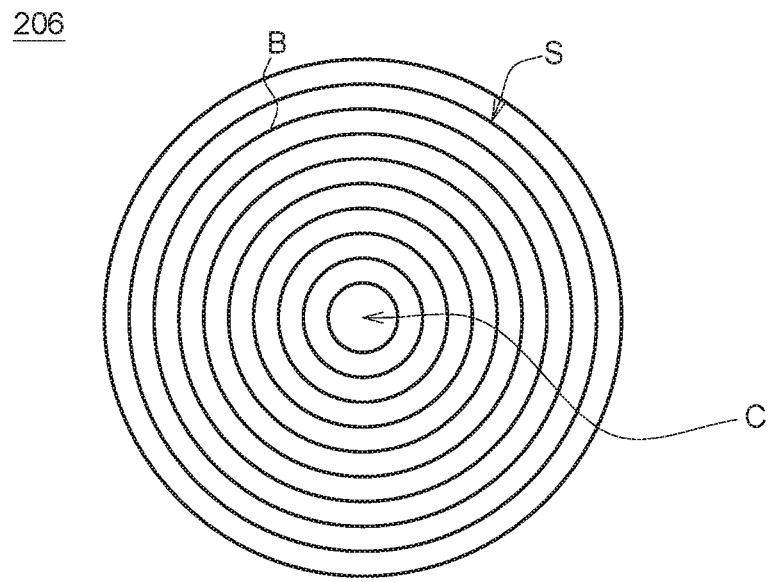
FIG. 2B illustrates a top view of a lens according to another embodiment.

For example, FIG. 2A and FIG. 2B illustrate a cross-section view of a light emitting diode packaging structure 202 and a top view of a lens 206 of the light emitting diode packaging structure 202 respectively according to another embodiment. For example, the light emitting diode packaging structure 202 may be a light emitting diode chip scale packaging structure. The light emitting diode packaging structure 202 in FIG. 2A is different from the light emitting diode packaging structure 102 in FIG. 1 in that the outer surface S of the lens 206 has a Fresnel lens structure. A bottom B of the concave portion of the outer surface S of the Fresnel lens structure has a concentric circle texture (FIG. 2B). In addition, the outer surface S of the lens 206 has a convex structure, and the center point C of the curve of the outer surface S in the cross-section view is the highest point of the convex structure.

FIG. 3 to FIG. 6 illustrate cross-section views of the light emitting diode packaging structures according to various embodiments.

Figure 3:
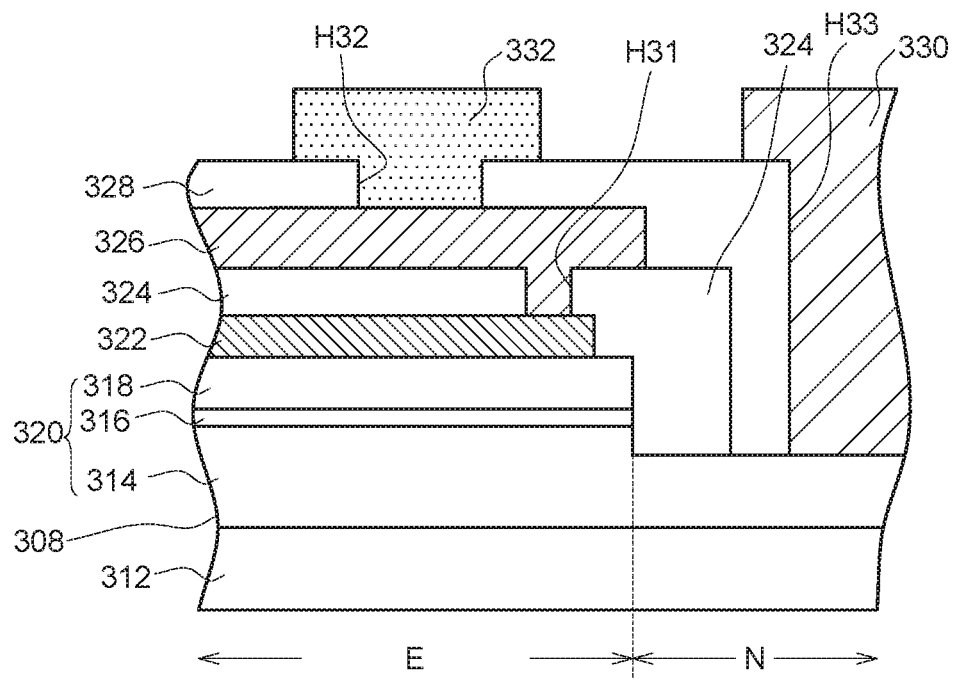
FIG. 3 illustrates a cross-section view of a light emitting diode packaging structure according to an embodiment.

Referring to FIG. 3, a light emitting unit 304 comprises a substrate 312 and a light emitting diode chip 308, such as a flip chip light emitting diode chip, on the substrate 312. The light emitting diode chip 308 comprises a first type semiconductor layer 314, an active layer 316 and a second type semiconductor layer 318 stacked on the substrate 312 in sequence. The first type semiconductor layer 314 has one of a N type conductivity and a P type conductivity, and the second type semiconductor layer 318 has the other of the N type conductivity and the P type conductivity. A light emitting diode stack unit 320 consists of the first type semiconductor layer 314, the active layer 316 and the second type semiconductor layer 318 in a light emitting region E. The light emitting diode chip 308 comprises a transparent conductive layer 322 disposed on the second type semiconductor layer 318 of the light emitting diode stack unit 320. The light emitting diode chip 308 comprises a Bragg reflective layer 324 disposed on the transparent conductive layer 322. The Bragg reflective layer 324 has a first through hole H31 exposing the transparent conductive layer 322 on the light emitting diode stack unit 320. The light emitting diode chip 308 comprises a metal layer 326 disposed on the Bragg reflective layer 324, and fills in the first through hole H31 of the Bragg reflective layer 324, such that metal layer 326 passing through the first through hole H31 can be connected with the transparent conductive layer 322 on the light emitting diode stack unit 320. The light emitting diode chip 308 comprises a protective layer 328 covering the metal layer 326. The protective layer 328 has a second through hole H32 exposing the metal layer 326. The light emitting diode chip 308 comprises a first electrode 330 filling in a third through hole H33 exposing the first type semiconductor layer 314 in an non-light emitting region N, and connecting with the first type semiconductor layer 314. The light emitting diode chip 308 comprises a second electrode 332 filling in the second through hole H32 of the protective layer 328, and connecting with the metal layer 326.

In some embodiments, the lens having the outer surface with the curve in the cross-section view (substantially) complying with the polynomial (I) having the degree of at least 4 (such as the lens 106 of FIG. 1, the lens 206 of FIG. 2A and FIG. 2B, or a lens of another kind not shown but (substantially) complying with the polynomial (I) having the degree of at least 4) consisting of the packaging encapsulant directly covers on the light emitting unit 304 (flip chip light emitting diode chip) so as to form a light emitting diode (chip scale) packaging structure.

Figure 4:
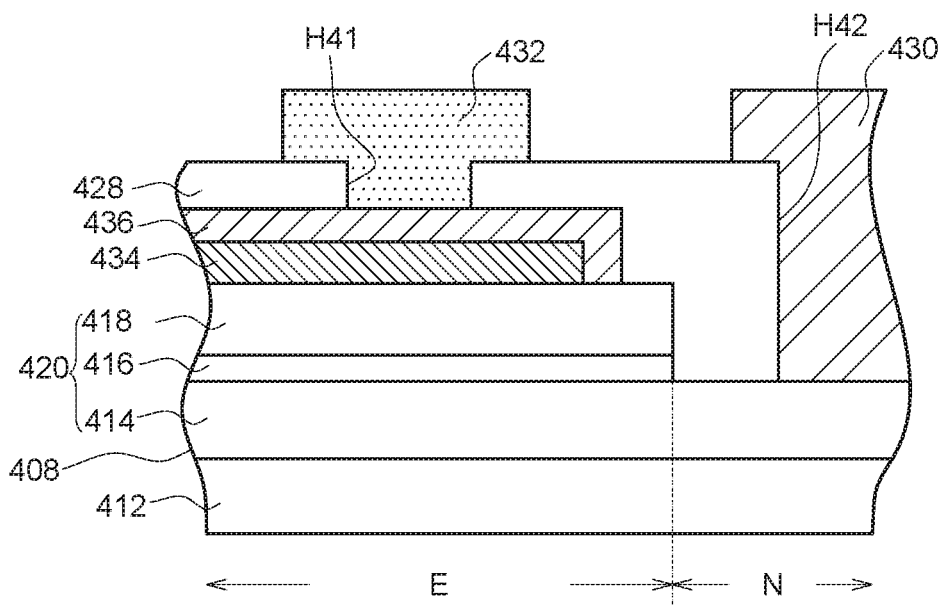
FIG. 4 illustrates a cross-section view of a light emitting diode packaging structure according to an embodiment.

Referring to FIG. 4, a light emitting unit 404 comprises a substrate 412 and a light emitting diode chip 408 such as a flip chip light emitting diode chip on the substrate 412. The light emitting diode chip 408 comprises a first type semiconductor layer 414, an active layer 416 and a second type semiconductor layer 418 stacked on the substrate 412 in sequence. The first type semiconductor layer 414 has one of the N type conductivity and the P type conductivity, and the second type semiconductor layer 418 has the other of the N type conductivity and the P type conductivity. A light emitting diode stack unit 420 consists of the first type semiconductor layer 414, the active layer 416 and the second type semiconductor layer 418 in the light emitting region E. The light emitting diode chip 408 comprises a reflective ohmic conductive layer 434 disposed on the second type semiconductor layer 418 of the light emitting diode stack unit 420. In an embodiment, the reflective ohmic conductive layer 434 may have a Ni/Ag/Pt alloy structure or a Ni/Al/Ti alloy structure. The light emitting diode chip 408 comprises a buffering layer 436 disposed on the reflective ohmic conductive layer 434. The light emitting diode chip 408 comprises a protective layer 428 covering the buffering layer 436. The protective layer 428 has a first through hole H41 exposing the buffering layer 436. The light emitting diode chip 408 comprises a first electrode 430 filling in a second through hole H42 exposing the first type semiconductor layer 414 in the non-light emitting region N, and connecting with the first type semiconductor layer 414. The light emitting diode chip 408 comprises a second electrode 432 filling in the first through hole H41 of the protective layer 428, and connecting with the buffering layer 436.

In some embodiments, the lens having the outer surface with the curve in the cross-section view (substantially) complying with the polynomial (I) having the degree of at least 4 (such as the lens 106 of FIG. 1, the lens 206 of FIG. 2A and FIG. 2B, or a lens of another kind not shown but (substantially) complying with the polynomial (I) having the degree of at least 4) consisting of the packaging encapsulant directly covers on the light emitting unit 404 (flip chip light emitting diode chip) so as to form a light emitting diode (chip scale) packaging structure. The lens (or packaging encapsulant) may be also in contact with a sidewall surface of the exposed element(s).

Figure 5:
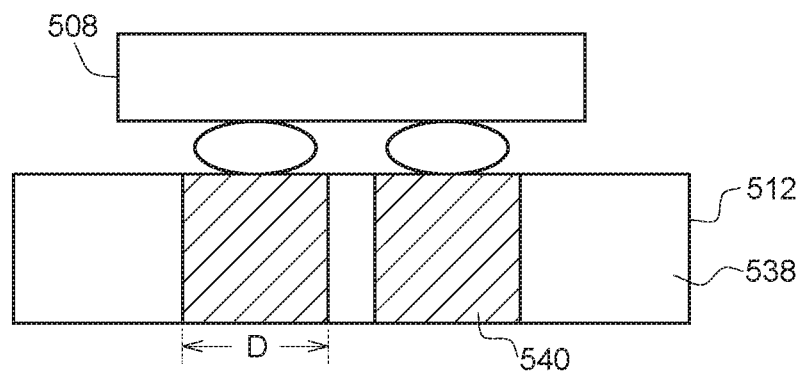
FIG. 5 illustrates a cross-section view of a light emitting diode packaging structure according to an embodiment.

Referring to FIG. 5, a light emitting unit 504 comprises a substrate 512 and a light emitting diode chip 508. The substrate 512 comprises an insulating layer 538 and a conductive pillar 540 passing through the insulating layer 538. In embodiments, the conductive pillar 540 may have a diameter D being 0.25 mm. The light emitting diode chip 508 is disposed on the substrate 512 by a flip chip method with using a solder material and is electrically connected with the conductive pillar 540 of the substrate 512. In embodiments, the light emitting unit 504 of such kind may have an area smaller than 3 mm×3 mm.

In some embodiments, the lens having the outer surface with the curve in the cross-section view (substantially) complying with the polynomial (I) having the degree of at least 4 (such as the lens 106 of FIG. 1, the lens 206 of FIG. 2A and FIG. 2B, or a lens of another kind not shown but (substantially) complying with the polynomial (I) having the degree of at least 4) consisting of the packaging encapsulant directly covers on the light emitting unit 504 (flip chip light emitting diode chip) so as to form a light emitting diode (chip scale) packaging structure. In other words, the lens (or packaging encapsulant) of the light emitting diode packaging structure is in contact with an upper surface of the exposed light emitting diode chip 508. The lens (or packaging encapsulant) of the light emitting diode packaging structure may be also in contact with an upper surface of the exposed substrate 512. The lens (or packaging encapsulant) may be also in contact with an exposed sidewall surface of the elements. The lens (or packaging encapsulant) may be also in contact with a sidewall surface of the exposed element(s).

Figure 6:
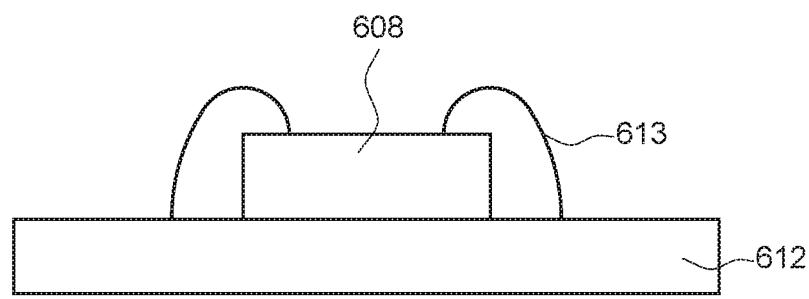
FIG. 6 illustrates a cross-section view of a light emitting diode packaging structure according to an embodiment.

Referring to FIG. 6, a light emitting unit 604 comprises a light emitting diode chip 608 and a substrate 612. The light emitting diode chip 608 on the substrate 612 is electrically connected to the substrate 612 with a bonding wire 613.

In some embodiments, the lens having the outer surface with the curve in the cross-section view (substantially) complying with the polynomial (I) having the degree of at least 4 (such as the lens 106 of FIG. 1, the lens 206 of FIG. 2A and FIG. 2B, or a lens of another kind not shown but (substantially) complying with the polynomial (I) having the degree of at least 4) consisting of the packaging encapsulant directly covers on the light emitting unit 604. In other words, the lens (or packaging encapsulant) is in contact with an upper surface and a sidewall surface of the exposed light emitting diode chip 608, and is in contact with the exposed bonding wire 613, and may be in contact with an upper surface and a sidewall surface of the exposed substrate 612.

In some embodiments, the light emitting unit of the light emitting diode (chip scale) packaging structure further comprises a wavelength converting layer (not shown) conformally disposed on at least on an upper surface or a sidewall surface of the light emitting diode chip. The wavelength converting layer is capable of being excited by a first light emitted from the light emitting diode chip to emit a second light having a wavelength different from a wavelength of the first light. A color tone of an emitting light of the light emitting diode packaging structure or the light emitting device may be adjusted by the wavelength converting layer. The wavelength converting layer may comprise a wavelength converting material such as a phosphor powder. In some embodiments, the lens having the outer surface with the curve in the cross-section view (substantially) complying with the polynomial (I) having the degree of at least 4 (such as the lens 106 of FIG. 1, the lens 206 of FIG. 2A and FIG. 2B, or a lens of another kind not shown but (substantially) complying with the polynomial (I) having the degree of at least 4) consisting of the packaging encapsulant is in contact with the exposed wavelength converting layer. The wavelength converting layer may have a single-layer structure or a multi-layer structure according to actual demands.

In embodiment, a light emitting device and a manufacturing method thereof are also provided.

FIG. 7A to FIG. 7G illustrate a manufacturing method of a light emitting device according to an embodiment.

Figure 7A:
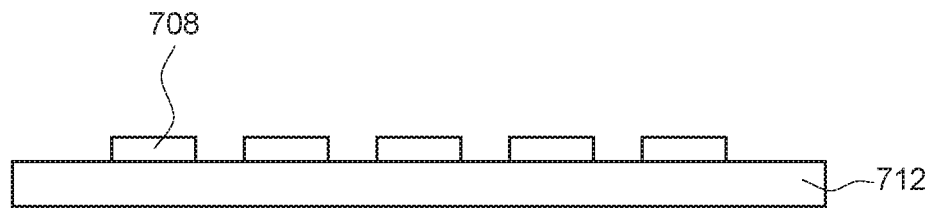
FIG. 7A to FIG. 7G illustrate a manufacturing method for a light emitting device according to an embodiment.

Referring to FIG. 7A, light emitting diode chips 708 are formed on a substrate 712. In embodiments, the light emitting diode chips 708 may be disposed on the substrate 712, and electrically connected to a conductive portion of the substrate 712 by a flip chip method or a wire bonding method. For example, the light emitting diode chips 708 may be similar to the light emitting diode chip 308, 408, 508 or 608 as shown in FIG. 3, 4, 5 or 6 respectively, or a light emitting diode chip of another kind not shown.

Figure 7B:
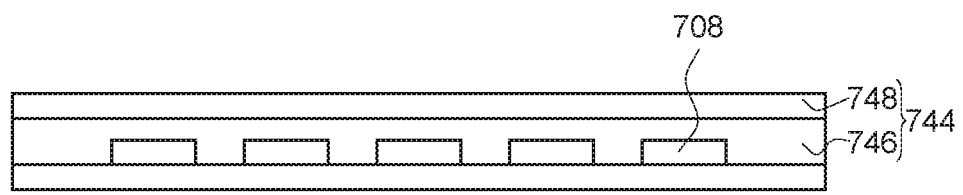

Referring to FIG. 7B, a wavelength converting layer 744 is formed on the light emitting diode chips 708. For example, the wavelength converting layer 744 comprises a first wavelength converting layer 746 and a second wavelength converting layer 748. The first wavelength converting layer 746 may be conformally formed on a light emitting side of the light emitting diode chips 708, for example on exposed upper surfaces of the light emitting diode chips 708. The first wavelength converting layer 746 may be also formed on exposed sidewall surfaces of the light emitting diode chips 708, and/or filled into an air gap between the light emitting diode chips 708. The second wavelength converting layer 748 is formed on the first wavelength converting layer 746. The first wavelength converting layer 746 and the second wavelength converting layer 748 may have wavelength converting characteristics different from each other.

Figure 7C:
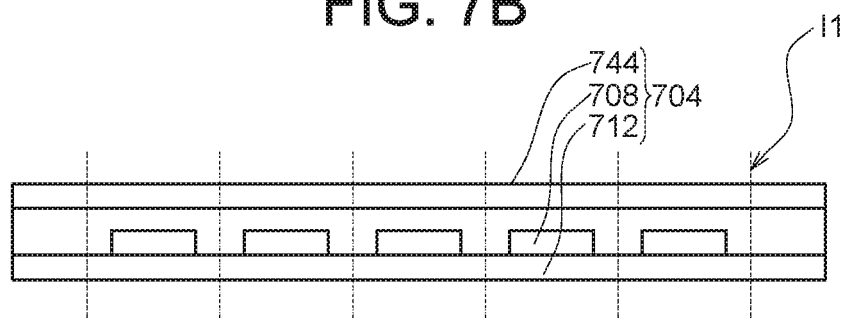

Referring to FIG. 7C, a cutting step I1 is performed to divide light emitting units 704 each consisting of the substrate 712, the light emitting diode chips 708, and the wavelength converting layer 744. The cutting step I1 may comprise cutting the wavelength converting layer 744 between the light emitting diode chips 708 together with the substrate 712.

Figure 7D:
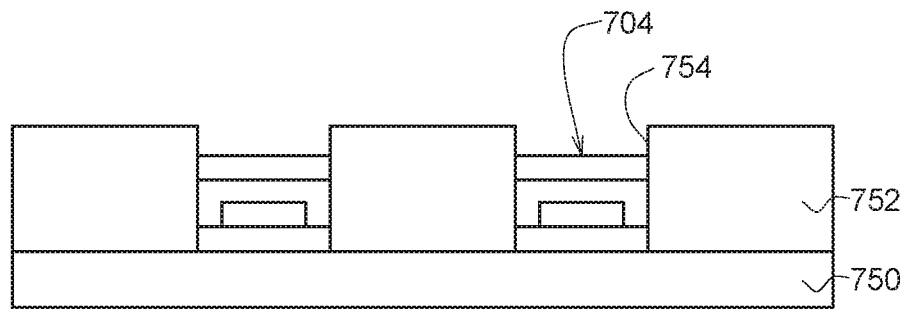

Referring to FIG. 7D, a carrier 750 with a mold 752 disposed thereon is provided. The carrier 750 may be a metal adhesive tape, or other suitable carrier structures. The mold 752 may have grooves 754 for example with an array arrangement, for receiving the light emitting units 704 arranged on the carrier 750. After the light emitting units 704 are disposed on the carrier 750, the mold 752 may be removed.

Figure 7E:
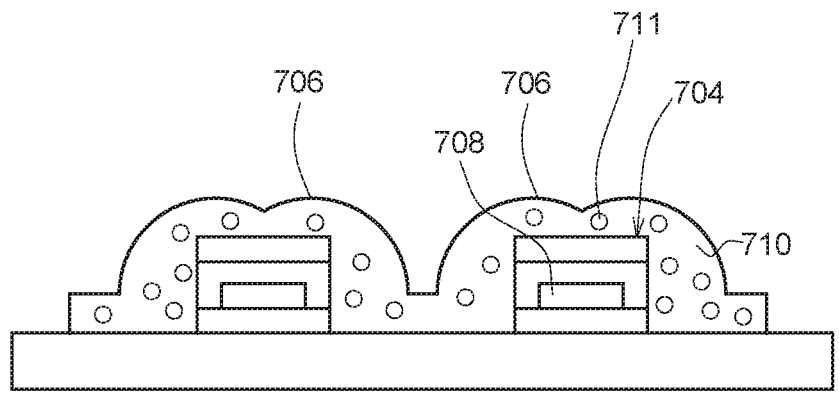

Referring to FIG. 7E, a packaging encapsulant 710 is formed to cover the light emitting units 704. The packaging encapsulant 710 is in contact with upper surfaces of the light emitting units 704, and may be in contact with sidewall surfaces of the light emitting units 704, or/and may be filled in an air gap between the light emitting units 704. As shown in the figure, in embodiments, the packaging encapsulant 710 comprises lenses 706, each having an outer surface with a curve in the cross-section view (substantially) complying with the above polynomial (I) having the degree of at least 4, and corresponding to the light emitting diode chips 708 respectively. The lenses 706 can be aligned with the light emitting diode chips 708 precisely. The packaging encapsulant 710 may comprise a diffusing particle (or diffusing particles) 711 or a wavelength converting particle (wavelength converting particles) doped in the packaging encapsulant 710.

Figure 7F:
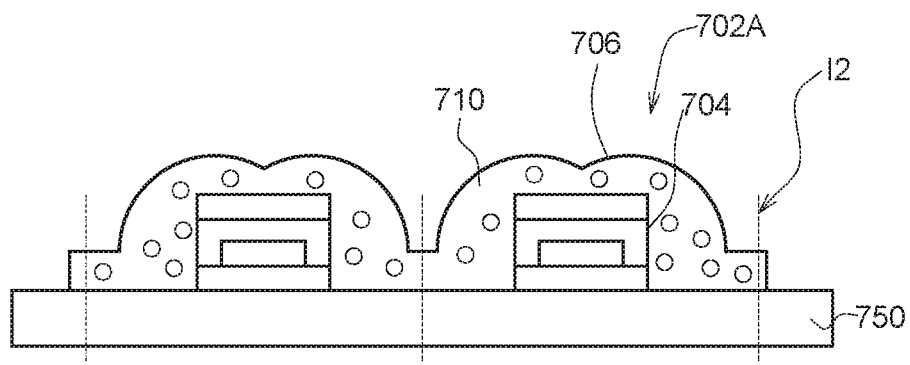

Referring to FIG. 7F, a cutting step I2 is performed to divide light emitting diode packaging structures 702A each consisting of the carrier 750, the light emitting unit 704 and the lenses 706. The cutting step I2 may comprise cutting the packaging encapsulant 710 between the light emitting units 704 together with the carrier 750. In some embodiments, after the cutting step I2, the carrier 750 may be removed.

Figure 7G:
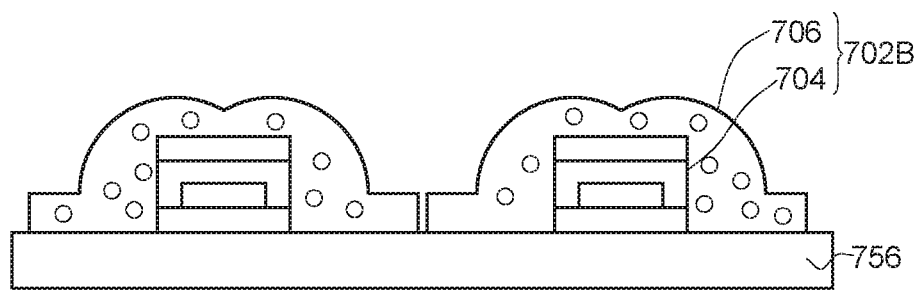

Referring to FIG. 7G, light emitting diode packaging structures 702B each consisting of the light emitting unit 704 and the lens 706 are respectively disposed on a circuit board 756. The light emitting diode packaging structures 702B may be electrically connected to the circuit board 756.

Accordingly, in embodiments, the manufacturing method comprises the step for forming the light emitting diode packaging structures 702B separated from each other, and each having the lens 706 having the outer surface with the curve in the cross-section view (substantially) complying with the polynomial (I) having the degree of at least 4 and corresponding to the light emitting unit 704 (referring to FIG. 7F). Then, the light emitting diode packaging structures 702B are individually disposed on the circuit board 756 (the step illustrated in FIG. 7G). Each of the light emitting diode packaging structures 702B is a package unit having the corresponding light emitting unit 704 and lens 706, and thus the step of disposing the light emitting diode packaging structures 702B on the circuit board 756 can have a larger tolerance. Therefore, a light emitting device 758 according to embodiments can be applied for a direct type back light module.

FIG. 8A to FIG. 8F illustrate a manufacturing method for a light emitting device according to another embodiment, which is different from the embodiment illustrated in FIG. 7A to FIG. 7G in that the wavelength converting layer is a single layer wavelength converting layer. A step before a step illustrated with FIG. 8A may be similar to the step illustrated with FIG. 7A, and is not repeated herein.

Figure 8A:
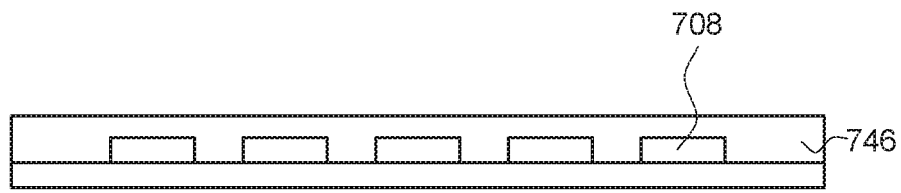
FIG. 8A to FIG. 8F illustrate a manufacturing method for a light emitting device according to another embodiment.

Referring go FIG. 8A, the (first) wavelength converting layer 746 is formed on the light emitting diode chips 708. The wavelength converting layer 746 may be conformally formed on the light emitting side of the light emitting diode chips 708, for example on the exposed upper surfaces of the light emitting diode chips 708. The wavelength converting layer 746 may be also formed on the exposed sidewall surfaces of the light emitting diode chips 708, and/or filled into the air gap between the light emitting diode chips 708.

Figure 8B:
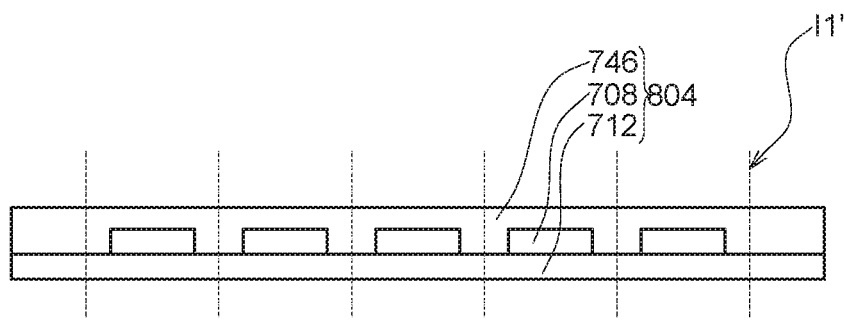

Referring to FIG. 8B, a cutting step I1' is performed to divide light emitting units 804 each consisting of the substrate 712, the light emitting diode chips 708, and the wavelength converting layer 746. The cutting step I1' may comprise cutting the wavelength converting layer 746 between the light emitting diode chips 708 together with the substrate 712.

Figure 8C:
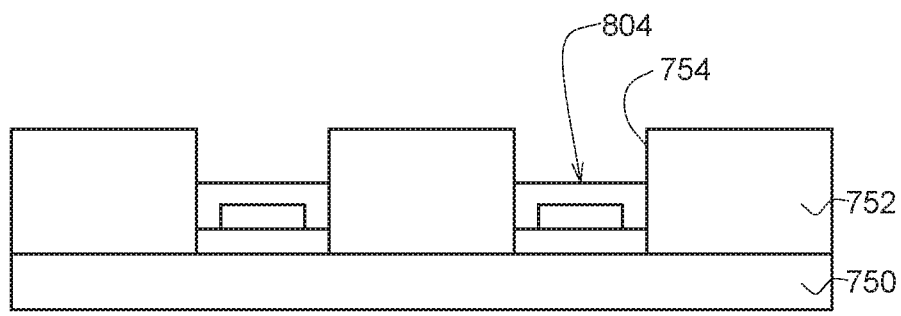

Referring to FIG. 8C, the carrier 750 with the mold 752 disposed thereon is provided. The mold 752 may have the grooves 754 for example with an array arrangement, for receiving the light emitting units 804 arranged on the carrier 750. After the light emitting units 804 are disposed on the carrier 750, the mold 752 may be removed.

Figure 8D:
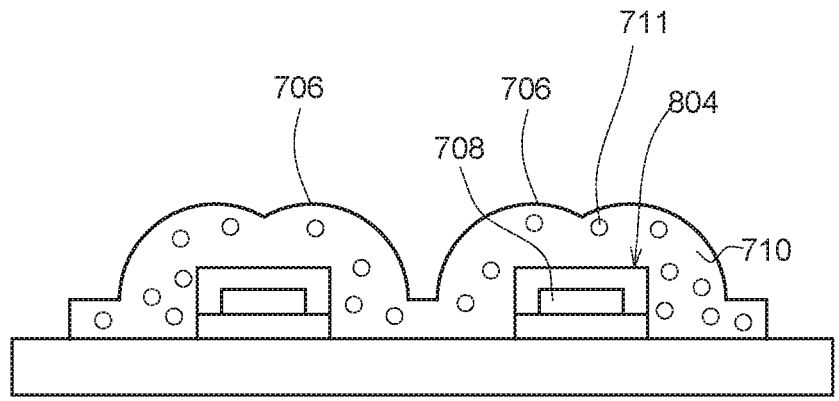

Referring to FIG. 8D, the packaging encapsulant 710 is formed to cover light emitting units 804. The packaging encapsulant 710 is in contact with upper surfaces of the light emitting units 804, and may be in contact with sidewall surfaces of the light emitting units 804, or/and may be filled in an air gap between the light emitting units 804. As shown in the figure, in embodiments, the packaging encapsulant 710 comprises the lenses 706, each having the outer surface with the curve in the cross-section view (substantially) complying with the above polynomial (I) having the degree of at least 4, and corresponding to the light emitting diode chips 708 respectively. The lenses 706 can be aligned with the light emitting diode chips 708 precisely. The packaging encapsulant 710 may comprise a diffusing particle (or diffusing particles) 711 or a wavelength converting particle (wavelength converting particles) doped in the packaging encapsulant 710.

Figure 8E:
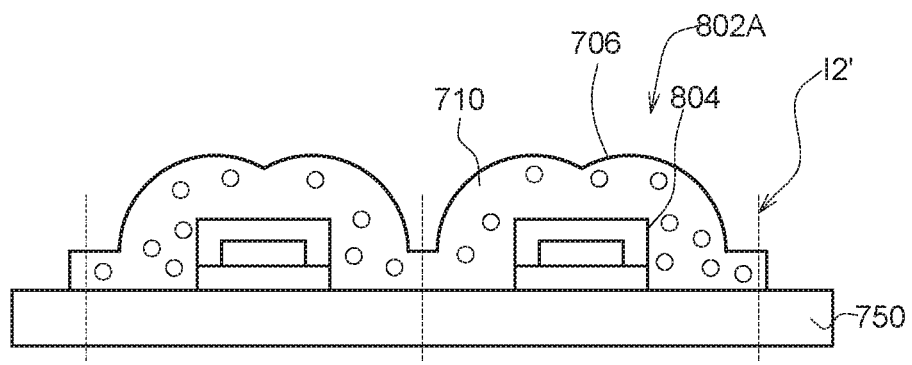

Referring to FIG. 8E, a cutting step I2' is performed to divide light emitting diode packaging structures 802A each consisting of the carrier 750, the light emitting unit 804 and the lenses 706. The cutting step I2' may comprise cutting the packaging encapsulant 710 between the light emitting units 804 together with the carrier 750. In some embodiments, after the cutting step I2', the carrier 750 may be removed.

Figure 8F:
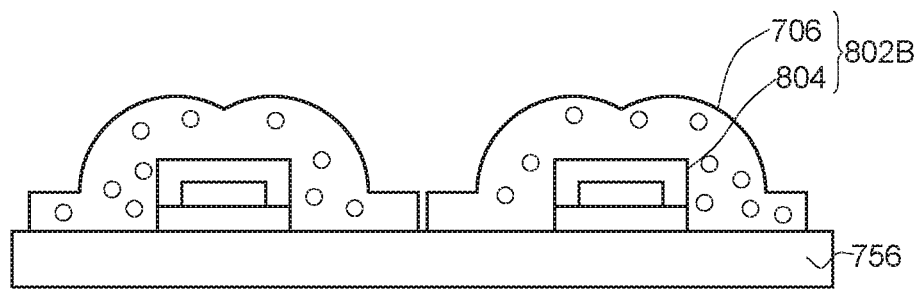

Referring to FIG. 8F, light emitting diode packaging structures 702B each consisting of the light emitting unit 804 and the lens 706 are respectively disposed on the circuit board 756. The light emitting diode packaging structures 802B may be electrically connected to the circuit board 756.

Accordingly, in embodiments, the manufacturing method comprises the step for forming the light emitting diode packaging structures 802B separated from each other, and each having the lens 706 having the outer surface with the curve in the cross-section view (substantially) complying with the polynomial (I) having the degree of at least 4 and corresponding to the light emitting unit 804 (referring to FIG. 8E). Then, the light emitting diode packaging structures 802B are individually disposed on the circuit board 756 (the step illustrated in FIG. 8F). Each of the light emitting diode packaging structures 802B is a package unit having the corresponding light emitting unit 804 and lens 706, and thus in the step of disposing the light emitting diode packaging structures 802B on the circuit board 756 can have a larger tolerance. Therefore, a light emitting device 858 according to embodiments can be applied for a direct type back light module.

The present disclosure is not limited to the foregoing embodiments, and may be properly varied with a structure, an elemental material, or a manufacturing method according to the disclosed concepts in embodiments or a combination of the concepts of different embodiments.

For example, the outer surface of the lens may have a concave structure, and a center point of the curve of the outer surface in the cross-section view is the lowest point of the concave structure. Alternatively, the outer surface of the lens may have a convex structure, and a center point of the curve of the outer surface in the cross-section view is the highest point of the convex structure.

The outer surface of the lens with the curve in the cross-section view (substantially) complying with the polynomial (I) having the degree of at least 4 may be a continuous curved surface, or may comprise a Fresnel Lens structure having non-continuous and segmental curved surfaces without changing the curvature as the continuous curved surface.

The lens may be a refractive lens or a reflective lens. In other words, a light emitting surface of the lens may be a refractive light emitting surface or a reflective light emitting surface.

The light emitting diode chip of the light emitting unit may comprise a first type semiconductor layer and a second type semiconductor layer having opposing conductivity types, and an active layer between the first type semiconductor layer and the second type semiconductor layer. A first electrode (one of a positive electrode and a negative electrode) and a second electrode (the other of the positive electrode and the negative electrode) are electrically connected to the first type semiconductor layer and the second type semiconductor layer, respectively. By applying voltages to the positive electrode and the negative electrode, an electron and a hole may be combined in the active layer to emit a light. The light emitting diode chip may optionally comprise other suitable elements for adjusting characteristics, for example a conductive layer (such as a transparent conductive layer, a metal layer, a reflective ohmic conductive layer), a reflective layer (such as a Bragg reflective layer, a reflective ohmic conductive layer), a protective layer, a buffering layer, or a through hole, or other arrangement methods. The light emitting diode chip may be a vertical light emitting diode, and may be electrically connected to a conductive element such as a contact pad etc. of a substrate by a flip chip method or a wire bonding method. An area of the light emitting diode chip according to embodiments may be smaller than 3 mm×3 mm, or may be other suitable sizes.

In some embodiments, the substrate on which the light emitting diode chip is disposed may be used as a back plate structure for adjusting a lighting profile and dissipating heat. For example, a surface of the substrate may have a reflective characteristic as an assist parameter for a light profile to adjust a scattering field. The back plate structure may have a thermal resistance smaller than 10° C./W. Therefore, the substrate used as the back plate structure could provide stable mechanical and optical properties.

For example, in some embodiments, the light emitting unit may comprise or not comprise a wavelength converting layer optionally. In some embodiments, the wavelength converting layer may be only conformally formed on (or in contact with) an upper surface of the light emitting diode chip, but not disposed on a sidewall surface of the light emitting diode, and not filled in an air gap between the light emitting diode chips. The wavelength converting layer may have a single layer wavelength converting structure, a double layer structure, a double layer wavelength converting structure having different wavelength converting characteristics for each layer, a wavelength converting structure having more layers having wavelength converting characteristics different from each other.

In some embodiments, there is no wavelength converting layer in the light emitting unit, and the lens consisting of the packaging encapsulant is contact with at least the upper light emitting surface of the light emitting diode chip, or may be further in contact with the sidewall surface of the light emitting diode chip, or may be further filled in the air gap between the light emitting diode chips. In some embodiments, the light emitting unit has the wavelength converting layer, the lens consisting of the packaging encapsulant is in contact with at least the wavelength converting layer on the upper light emitting surface of the light emitting diode chip, or may be further in contact with the sidewall surface of the light emitting diode chip or the wavelength converting layer on the sidewall surface of the sidewall surface of the light emitting diode chip, or may be further filled in the air gap between the light emitting diode chips.

For example, in some embodiments, the packaging encapsulant of the light emitting diode packaging structure such as the light emitting diode chip scale packaging structure may optionally comprise an optical particle doped therein or have no optical particle. The optical particle may comprise a diffusing particle, a wavelength converting material (particle), or other materials (particles) capable of adjusting a lighting characteristic of a light from the light emitting diode chip. The particle may comprise a micro-size scale particle or a nano-size scale particle.

In addition to the lens having the outer surface with the curve in the cross-section view (substantially) complying with the polynomial (I) having the degree of at least 4, for example, the emitting light characteristic of the light emitting diode packaging structure such as the light emitting diode chip scale packaging structure may be adjusted by the wavelength converting layer of the light emitting unit and/or the wavelength converting material (particle) doped in the packaging encapsulant of which the lens consists. For example, a light (such as a blue light) emitted from the light emitting diode chip may be converted into a light in a different color (wavelength) (such as a green light, a yellow light, or a red light, etc.) by the wavelength converting layer and/or the wavelength converting material (particle). Then, the lights of different colors may be mixed to obtain a white light, or a light of another expected color tone.

In some embodiments, the light emitting diode packaging structure such as the light emitting diode chip scale packaging structure is a white light source having an emission angle larger than or equal to 150 degrees.

The light emitting diode packaging structure or the light emitting device according to embodiments may be applied from a light emitting product properly according actual demands, such as a front light module or a back light module of a display device, or a lighting product such as a bay lighting product, a wall-washing lighting product, etc.

Accordingly, the embodiments of the present disclosure have at least the following advantages. The lens having the outer surface with the curve of which in the cross-section view (substantially) complying with the polynomial (I) having the degree of at least 4 is applied for directing a light emitted from the light emitting unit to a desired location precisely such that the device can have an improved display effect. Alternatively, there is no additional air gap between the light emitting unit and the packaging encapsulant, and thus the structure can have a small thickness, which facilitates miniaturizing or thinning designs as applied to the device. Alternatively, as the lens having the outer surface with the curve of which in the cross-section view (substantially) complying with the polynomial (I) having the degree of at least 4 has a Fresnel lens structure, the device can have a decreased material quantity for the lens, and thus a manufacturing cost, a weight, a volume and a thickness for the device can be reduced. In the manufacturing method for the light emitting device, the light emitting diode packaging structure having the corresponding light emitting unit and lens is formed, and then is disposed as a package unit on the circuit board. Therefore, the method can have a larger tolerance. In addition, a desired light emitting effect of the light emitting diode packaging structure is maintained.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting diode chip scale packaging structure, comprising:
a light emitting unit comprising a light emitting diode chip; and
a lens covering the light emitting diode chip, wherein a curve of an outer surface of the lens in a cross-section view substantially complies with a polynomial of:

$$z=-0.0005y^6-0.0059y^5+0.0871y^4-0.3718y^3+0.5658y^2-0.0709y+2.5046,$$

z is a variable of vertical axis of the curve, y is a variable of horizontal axis of the curve, a center point of the curve corresponding to the light emitting diode chip is a coordinate where y is 0 and z is 2.5046, wherein a correlation coefficient calculated from fitting the curve to the polynomial is larger than or equal to 0.995, the outer surface has a concave structure, the center point of the curve is the lowest point of the concave structure, the lens is in contact with the light emitting unit, and no air gap is between the lens and the light emitting unit.

2. The light emitting diode chip scale packaging structure according to claim 1, further comprising a substrate, wherein the light emitting diode chip is on the substrate, wherein the substrate comprises an insulating layer and a conductive pillar passing through the insulating layer, the conductive pillar has a diameter of 0.25 mm.

3. The light emitting diode chip scale packaging structure according to claim 1, wherein the lens further comprises a diffusing particle doped therein.

4. The light emitting diode chip scale packaging structure according to claim 1, further comprising a first wavelength converting layer on the light emitting diode chip.

5. A direct type back light module, comprising:
a circuit board; and
a plurality of light emitting diode chip scale packaging structures, each comprising:
a light emitting unit comprising a light emitting diode chip; and
a lens covering the light emitting diode chip, wherein a curve of an outer surface of the lens in a cross-section view substantially complies with a polynomial of:

$$z=-0.0005y^6-0.0059y^5+0.0871y^4-0.3718y^3+0.5658y^2-0.0709y+2.5046,$$

z is a variable of vertical axis of the curve, y is a variable of horizontal axis of the curve, a center point of the curve corresponding to the light emitting diode chip is a coordinate where y is 0 and z is 2.5046, wherein a correlation coefficient calculated from fitting the curve to the polynomial is larger than or equal to 0.995, the outer surface has a concave structure, the center point of the curve is the lowest point of the concave structure, the lens is in contact with the light emitting unit, and no air gap is between the lens and the light emitting unit, wherein the plurality of the light emitting diode chip scale packaging structures is disposed apart on the circuit board and is electrically connected to the circuit board.

6. A manufacturing method for a light emitting device, comprising:
forming a light emitting diode packaging structure by a forming method comprising forming a lens to cover a light emitting unit comprising a light emitting diode chip, wherein a curve of an outer surface of the lens in a cross-section view substantially complies with a polynomial of:

$$z=-0.0005y^6-0.0059y^5+0.0871y^4-0.3718y^3+0.5658y^2-0.0709y+2.5046,$$

z is a variable of vertical axis of the curve, y is a variable of horizontal axis of the curve, a center point of the curve corresponding to the light emitting diode chip is a coordinate where y is 0 and z is 2.5046, wherein a correlation coefficient calculated from fitting the curve to the polynomial is larger than or equal to 0.995, the outer surface has a concave structure, the center point of the curve is the lowest point of the concave structure, the lens is in contact with the light emitting unit, and no air gap is between the lens and the light emitting unit.

7. The manufacturing method for the light emitting device according to claim 6, further comprising disposing the light emitting diode packaging structure on a circuit board.

8. The manufacturing method for the light emitting device according to claim 7, wherein the lens and the light emitting diode chip are disposed on the circuit board at the same time.

9. The manufacturing method for the light emitting device according to claim 6, comprising forming a plurality of the light emitting diode packaging structures, wherein the forming method for the plurality of the light emitting diode packaging structures comprises:

disposing a plurality of the light emitting diode chips on a carrier; and forming a packaging encapsulant to cover the plurality of the light emitting diode chips, wherein the packaging encapsulant comprises a plurality of the lens corresponding to the plurality of the light emitting diode chips.

10. The manufacturing method for the light emitting device according to claim 9, wherein the forming method for the plurality of the light emitting diode packaging structures further comprises cutting the packaging encapsulant between the plurality of the light emitting diode chips.

11. The manufacturing method for the light emitting device according to claim 9, wherein the forming method for the plurality of the light emitting diode packaging structures further comprises cutting the carrier between the plurality of the light emitting diode chips.

* * * * *